United States Patent
Imamura

(10) Patent No.: US 10,281,539 B2
(45) Date of Patent: May 7, 2019

(54) SUPERCONDUCTING MAGNET DEVICE OR MAGNETIC RESONANCE IMAGING APPARATUS INCLUDING A SUPPORT MEMBER HAVING A COEFFICIENT OF THERMAL EXPANSION HIGHTER THAN THAT OF A COLUMNAR MEMBER

(71) Applicant: Hitachi, Ltd., Chiyoda-ku, Tokyo (JP)

(72) Inventor: Yukinobu Imamura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 249 days.

(21) Appl. No.: 15/230,874

(22) Filed: Aug. 8, 2016

(65) Prior Publication Data
US 2017/0052237 A1 Feb. 23, 2017

(30) Foreign Application Priority Data
Aug. 19, 2015 (JP) .................................. 2015-161533

(51) Int. Cl.
*G01V 3/00* (2006.01)
*G01R 33/38* (2006.01)
(Continued)

(52) U.S. Cl.
CPC ..... *G01R 33/3804* (2013.01); *G01R 33/3815* (2013.01); *H01F 6/04* (2013.01)

(58) Field of Classification Search
CPC ... H01F 6/04; H01F 6/06; H01F 6/006; H01F 6/00; H01F 6/008; G01R 33/3815; G01R 33/3804; G01R 33/24; G01R 33/385; G01R 33/3875; F25D 19/006; H01B 12/10; A61B 5/055; H01L 39/14
(Continued)

(56) References Cited

U.S. PATENT DOCUMENTS

| 5,757,257 A * | 5/1998 | Doi ......................... H01F 6/008 324/318 |
| 6,861,933 B1 * | 3/2005 | Yoshida ............. G01R 33/3873 324/319 |
| 9,620,272 B2 * | 4/2017 | Nakayama ................ H01F 6/04 |

FOREIGN PATENT DOCUMENTS

JP 8-138928 A 5/1996
JP 2003-142744 A 5/2003

* cited by examiner

*Primary Examiner* — Vinh P Nguyen
(74) *Attorney, Agent, or Firm* — Crowell & Moring LLP

(57) ABSTRACT

The present invention addresses a challenge of providing a superconducting magnet device that enables it to realize an operation of opening and closing a permanent current switch of the superconducting magnet device at high speed with small electric heater capacity, avoiding an increase in the amount of heat incursion into the superconducting coil by not providing a driving mechanism from outside while enabling it to reduce refrigerant consumption or electric power consumed by a refrigerator, or an MRI apparatus using it having means for obtaining good image quality. The superconducting magnet device including a superconducting coil and a permanent current switch to enable it to realize permanent current flowing with the permanent current switch operated by an electric heater or an MRI apparatus using it has a heat transfer member to cool the permanent current switch from a cooling stage with solid conductivity and a thermal switch, and the thermal switch generates a gap in a heat transfer path including the heat transfer member for cooling and a refrigerator by thermal expansion when an electric heater is electrified.

7 Claims, 8 Drawing Sheets

(51) Int. Cl.
*H01F 6/04* (2006.01)
*G01R 33/3815* (2006.01)

(58) Field of Classification Search
USPC .......................................................... 324/322
See application file for complete search history.

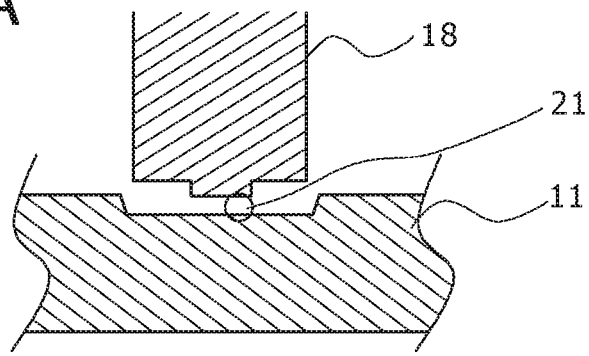
FIG.6A
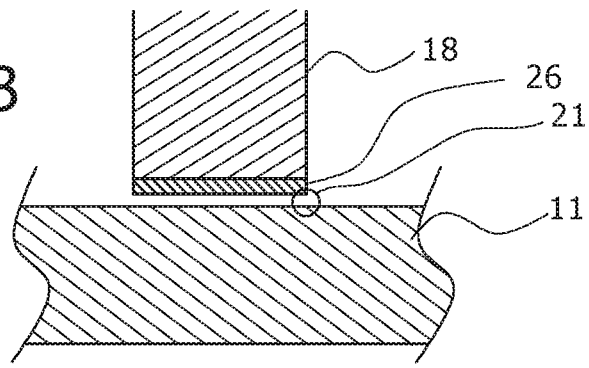
FIG.6B
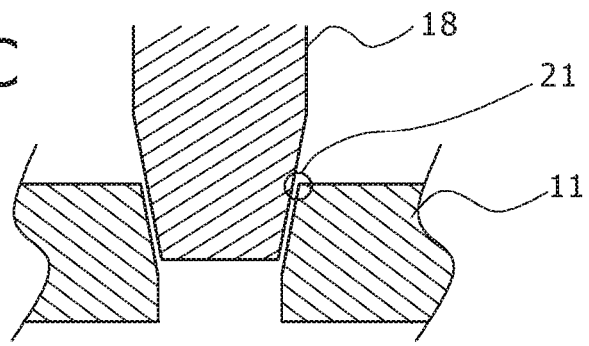
FIG.6C
FIG.6D  FIG.6E
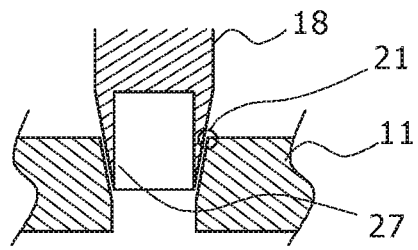
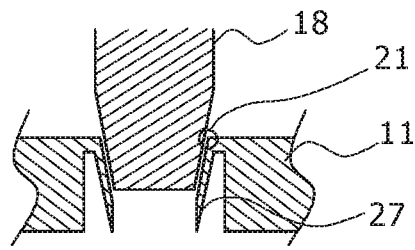

SUPERCONDUCTING MAGNET DEVICE OR MAGNETIC RESONANCE IMAGING APPARATUS INCLUDING A SUPPORT MEMBER HAVING A COEFFICIENT OF THERMAL EXPANSION HIGHTER THAN THAT OF A COLUMNAR MEMBER

BACKGROUND

The present invention relates to a permanent current switch that switches a superconducting coil operating under conduction cooling between a permanent current state and a power supply connection state in a superconducting magnet device or a magnetic resonance imaging apparatus using that magnet device.

As the background art in the present technical field, there is a publication, Japanese Unexamined Patent Application Publication Hei8-138928. In this publication, there is disclosed a technique for making a superconducting coil stable thermally and decreasing heater capacity with heating means for heating the superconducting coil of a permanent current switch and a thermal switch for thermally shirt-circuiting and decoupling the permanent current switch part to/from a cooling stage cooled with a cooling source. In Japanese Unexamined Patent Application Publication No. 2003-142744, a technique is found that obtains the function and operation of a thermal switch in a permanent current switch that is cooled via a thermal switch heat transfer plate by using a material having a large thermal conductivity at a temperature of 20 K and a small coefficient of thermal conductivity at 100 K for the material of the thermal switch heat transfer plate.

SUMMARY

As shown in Patent Document 1, by providing the thermal switch for thermally shirt-circuiting and decoupling the permanent current switch to/from a cooling stage cooled with a cooling source, the amount of heat generated by an electric heater which heats the permanent current switch can be decreased. However, the thermal switch requires a driving mechanism from outside of a magnet device. Around the driving mechanism, temperature outside the magnet device is ordinary temperature. This causes an increase in the amount of heat incursion into the cooling increase stage and an increase in refrigerant consumption or refrigerator load for keeping the superconducting magnet device at an extremely low temperature. The magnet device is enclosed in a vacuum case to keep the superconducting coil at an extremely low temperature. For this reason, to provide an operation mechanism from outside, a driving structure enabling operation, while keeping vacuum, which is called bellows, is required. In case damage or failure should occur because of driving, it is needed to unseal the vacuum case and make a repair.

In Japanese Unexamined Patent Application Publication No. 2003-142744, the use of a material whose thermal conductivity is temperature-dependent as the heat transfer plate from the cooling stage makes an operation mechanism from outside unnecessary and there is no care about an increase in the amount of heat incursion and failure because of driving operation. Nevertheless, the heat transfer plate always continues to be cooled from the cooling stage. To switch the permanent current switch from a low temperature state (closed) to a high temperature state (open), it is needed to increase the temperature of the heat transfer plate being cooled continuously concurrently with temperature increase of the permanent current switch. This makes it difficult to decrease electric heater capacity. Consequently, this causes an increase in refrigerant consumption or electric power consumed by a refrigerator. Also when switching is made from the high temperature state (open) to the low temperature state (closed), it takes time before cooling the permanent current switch enough, since the heat transfer plate in the high temperature state has a small coefficient of thermal conduction.

The present invention, developed in view of circumstances discussed above, addresses a challenge of providing a superconducting magnet device that enables it to realize an operation of opening and closing the permanent current switch at high speed with small electric heater capacity. The invention also addresses a challenge of providing a superconducting magnet device without provision of a driving mechanism from outside, thereby avoiding an increase in the amount of heat incursion into the superconducting coil and enabling it to reduce refrigerant consumption or electric power consumed by a refrigerator.

To solve the above challenges, a superconducting magnet device of the present invention includes a superconducting coil, a permanent current switch forming a closed circuit along with the superconducting coil, a first electric heater which is laid on the permanent current switch, a support member which is fixed to the permanent current switch, a second electric heater which is laid on the support member, a first cooling member which is cooled by a refrigerant or a refrigerator, and a first columnar member which is placed between the permanent current switch and the first cooling member and fixed to one of the permanent current switch and the first cooling member. The support member has a coefficient of thermal expansion that is higher than the coefficient of thermal expansion of the first columnar member.

According to the present invention, it is possible to provide a superconducting magnet device that enables it to realize an operation of opening and closing the permanent current switch at high speed with small electric heater capacity. By dispensing with a driving mechanism from outside, it is possible to provide a superconducting magnet device which avoids an increase in the amount of heat incursion into the superconducting coil and reduces refrigerant consumption or electric power consumed by a refrigerator.

BRIEF DESCRIPTION OF THE DRAWINGS

FIGS. 6A to 6E are partial cross-sectional views depicting the structure of a contact portion between a heat transfer member for cooling which is a component part of the permanent current switch which is a component of the first embodiment and a cooling stage;

DETAILED DESCRIPTION

Figure 1A:
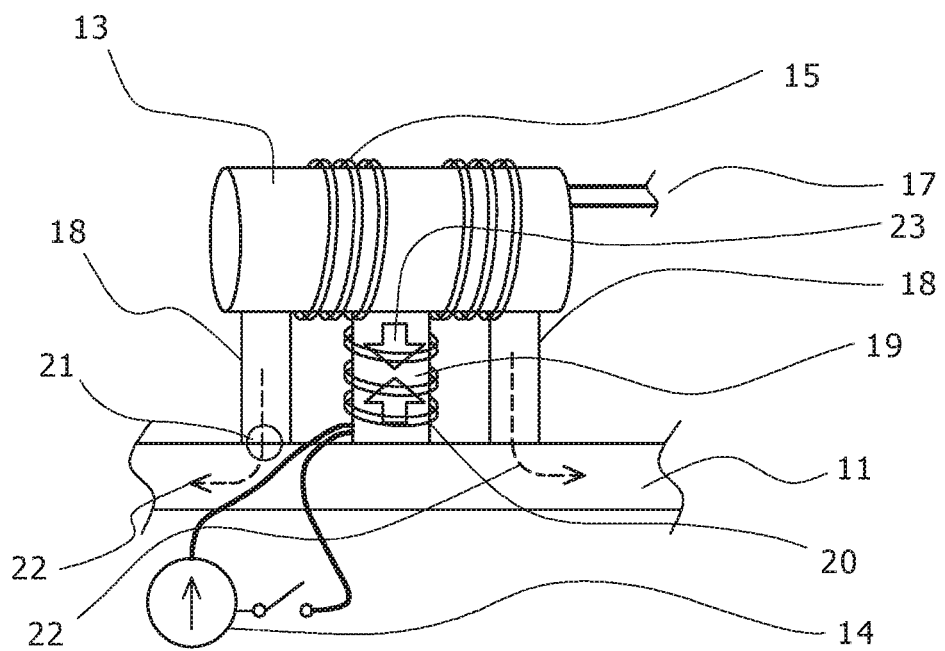
FIGS. 1A to 1C are schematic external perspective views of a permanent current switch part of a superconducting magnet device which is a first embodiment of the present invention.

A superconducting magnet device is a device that generates a strong magnetic field by passing a large current through a coil which is produced using a superconducting wire made of a material which becomes superconductive with its electrical resistance being substantially zero generally in an extremely low temperature environment (at an absolute temperature of 100 K and below). To keep the superconductive coil superconducting at an extremely low temperature, there are roughly two cases of immersing the coil in a cryogenic coolant such as liquid helium, and cooling the coil on contact with a solid which is a good heat conductor such as metal by a refrigerator.

A magnetic resonance imaging apparatus (hereinafter referred to as an MRI apparatus) is an apparatus which obtains a cross-sectional image representing physical and chemical properties of a subject body, making use of a nuclear magnetic resonance phenomena which takes place, while the subject body placed in a uniform static magnetic field is being irradiated with high frequency pulses; this apparatus is used for, particularly, medial application.

An MRI apparatus is comprised principally of a magnet device which generates a uniform static magnetic field in an image capturing space into which a subject body is inserted, a gradient coil which generates a pulse-form magnetic field with a spatial gradient in field strength in the image capturing space to assign positional information to the image capturing space, an RF coil which irradiates a subject body with high frequency pulses, a receiving coil which receives magnetic resonance signals from the subject body, and a computer system which processes the received signals and displays an image.

As means for improving MRI apparatus performance, it is taken to enhance the strength or uniformity of a static magnetic field which is generated by the magnet device. A stronger static magnetic field produces a sharp image and a static magnetic field that is more uniform across a wide space can produce a sharp image over a wide range. So, it is required for an MRI apparatus to enhance the strength and uniformity of the magnetic field. For this reason, a superconducting coil that is capable of generating a strong magnetic field is often used for the magnet device of currently mainstream MRI apparatus.

Moreover, to obtain a high quality image, a static magnetic field which is generated by the magnet device must be stable over time. With the static magnetic field varying over time, an image is disordered, even though the static magnetic field is strong, and it is difficult to obtain a good image. Because a current that is provided from a power supply device slightly varies over time, affected by disturbance from outside, there is also a small variation over time in a static magnetic field which is generated by a magnet device comprised of a superconducting coil that is present in a circuit including the power supply device. For this reason, a superconducting magnet device which is used in an MRI apparatus is decoupled from the power supply device, after a current starts to pass through it. A current continues to flow in the circuit of the magnet device decoupled from the power supply, because the resistance of the superconducting coil is zero, and this current is called a permanent current.

To realize a permanent current state of the magnet device, a permanent current switch is needed in addition to the superconducting coil and the power supply device. The permanent current switch is placed in an open (Off) state, when a current from the power supply device is allowed to flow into the superconducting coil. In this state, both the permanent current switch and the superconducting coil placed in a parallel circuit state are connected to the power supply device. At this time, a current flows through the superconducting coil, whereas the permanent current switch is placed in a state that no current flows through it. When a desired current flows through the superconducting coil, the permanent current switch is closed (On) to decrease the current from the power supply device. The permanent current switch is made of a superconducting wire and its electrical resistance becomes substantially zero, when closed (On). Consequently, a current flowing in the superconducting coil circulates in a closed circuit with an electrical resistance of substantially zero via the permanent current switch and it is enabled to maintain a constant current value without supply of current from the power supply device.

An action to open and close the permanent current switch is realized by switching the superconducting wire which makes the permanent current switch between a superconducting state (closed) and normal conducting state (open). That is, in the superconducting state, electrical resistance is substantially zero and, therefore, a current flows; whereas, in the normal conducting state, electrical resistance becomes high and, therefore, a current does not flow. As a method for switching the superconducting wire of the permanent current switch between the superconducting state and the normal conducting state, an electric heater is generally used. In the open state, the normal conducting and high resistance state is maintained by increasing the temperature of the superconducting wire which makes the permanent current switch by the electric heater. In the closed state, passing a current to the electric heater is stopped and the superconducting state with a zero electrical resistance is realized by cooling the superconducting wire.

Therefore, the permanent current switch is required to operate to rapidly increase the wire temperature when the electric heater is electrified and rapidly cool the wire when the electric heater is turned off. In an MRI apparatus using a common superconducting magnet, a niobium titanium wire is used as the superconducting wire which makes the superconducting coil as well as the permanent current switch. The niobium titanium wire is immersed in a liquid helium refrigerant, generally at a temperature of approximately 4 K, to put it in the superconducting state. Because the niobium titanium wire changes from the superconducting state to the normal conducing state with a relatively small increase in temperature, an action to make only the permanent current switch transit to the normal conducting state with a small-capacity electric heater is comparatively easy.

Meanwhile, for a high temperature superconducting material which is now being developed vigorously, its temperature of transition to normal conduction, at which it changes from the superconducting state to the normal conducting state, is 10 K or higher, which means that it is possible to keep the material superconducting up to a higher temperature as compared with the niobium titanium wire. Therefore, a superconducting magnet device having a coil which is made of a wire of a high temperature superconducting material is foreseen to be applied to an MRI apparatus in future, since a liquid helium refrigerant and a reservoir for the liquid refrigerant are no longer needed for cooling and it is possible to reduce electric power consumed by a refrigerator to maintain an extremely low temperature.

However, it is required to cool a wire made of a high temperature superconducting material (high temperature superconducting wire), giving a margin for the temperature of transition to normal conduction, in order to stably keep the wire superconducting. Likewise for the permanent current switch, it is required to cool it sufficiently in the superconducting state (closed). On the other hand, to make transition to the normal conducting state (open), the wire is heated by the electric heater, as done for the niobium titanium wire. To heat a high temperature superconducting wire, the heater output has to be increased, because temperature difference to rise up to the temperature of transition to normal conduction is larger and specific heat is larger, as compared with the niobium titanium wire. Therefore, for a permanent current switch using a high temperature superconducting wire, it is required to enhance both the capabilities of cooling and heating which are contradictory.

In the following, embodiments will be described by way of the drawings.

First Embodiment

Figure 2:
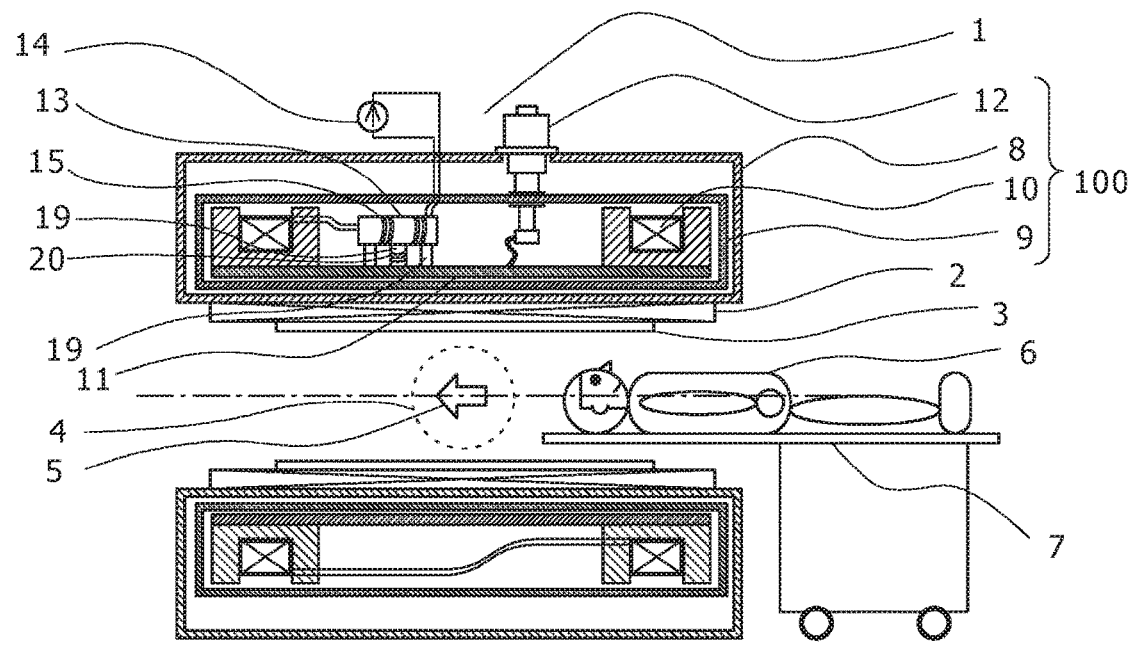
FIG. 2 is a schematic cross-sectional view of an MRI apparatus using the superconducting magnet device which is the first embodiment of the present invention.

As is depicted in FIG. 2, a common MRI apparatus 1 includes a superconducting magnet device 100 which is hollow and has a substantially cylindrical form and a gradient coil 2 and a high frequency irradiation coil 3 which are cylindrical and substantially concentric with the superconducting magnet device 100. The superconducting magnet device generates a static magnetic field in a direction indicated by an arrow 5 in an image capturing space 4. A subject 6 is carried into the image capturing space with a movable bed 7 and an image is obtained. Although not depicted, the gradient coil 2 generates a pulse-form dynamic magnetic field in which the density of magnetic flux changes linearly in the image capturing space 4, thereby assigning positional information to the image capturing space 4 and the high frequency irradiation coil 3 performs high frequency magnetic field irradiation in the image capturing space 4, thereby inducing a magnetic resonance phenomenon. A magnetic resonance signal is received by a receiving antenna which is not depicted and a tomographic image of the subject is obtained by an image processing and display device which is not depicted.

The inside of the superconducting magnet device 100 is kept vacuum by a vacuum case 8 covered with a plastic cover which is not depicted. Moreover, the amount of incoming heat due to electric heat radiated from outside is reduced by a radiation shield 9, so that a superconducting coil 10 which is produced by winding a superconducting wire will be maintained at an extremely low temperature. Furthermore, by conduction cooling the superconducting coil 10 on contact with a cooling stage 11 (first cooling member) which is made of a good heat conducting material by a refrigerator 12 or by filling a reservoir with a refrigerant such as liquid helium which is not depicted, the coil temperature in a superconducting state is maintained. MRI apparatus like the one depicted in FIG. 2 is generally called a horizontal magnetic field type. In the present embodiment, a member which is cooled by the refrigerator 12 or refrigerant and provided in contact with an object to be cooled is referred to as first cooling means.

Figure 3:
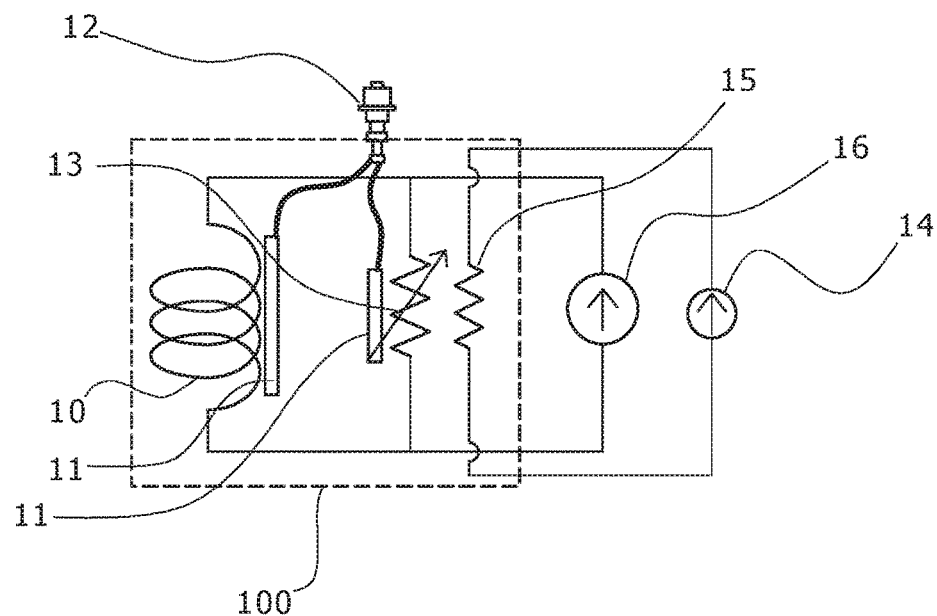
FIG. 3 is a conceptual diagram depicting a circuit configuration including a superconducting coil, a permanent current switch, and a power supply for exciting the superconducting coil and a cooling arrangement in a superconducting magnet device according to related art.

To obtain a good image by the MRI apparatus 1 having the superconducting magnet device 100 as a source generating a static magnetic field, it is important to spatially uniform a static magnetic field which is generated by the superconducting coil 10 and to suppress variation over time. For this purpose, a permanent current switch 13 which realizes permanent current flowing is used. The permanent current switch 13 has a structure in which a superconducting wire is wound on a reel in a noninductive state that no magnetic field is generated and a current is passed through an electric heater 15 laid on the permanent current switch 13 to increase its temperature by supplying electric power from a heater power supply 14 for the permanent current switch, which is typically located outside of the superconducting magnet device 100. FIG. 3 depicts a circuit configuration including the superconducting coil 10, the permanent current switch, and a power supply 16 for exciting the superconducting coil.

At the same time, FIG. 3 depicts a conceptual configuration of a circuit of an electric heater 15 (first electric heater) for heating the permanent current switch 13 and the refrigerator 12 and the cooling stage 11 for cooling. To pass a current through the superconducting coil 10 and excite it, a current is supplied from the power supply 16 for excitation. At this time, the permanent current switch 13 is heated by the electric heater 15 which is an electrically independent separate circuit and the superconducting wire which makes the permanent current switch 13 is placed in a normal conducting state and a large resistance value arises. Therefore, the permanent current switch 13 is placed in an open (Off) state and a current supplied from the power supply 16 for excitation will flow through the superconducting coil 10.

When a desired current flows through the superconducting coil 10, in this state, passing a current to the electric heater 15 is stopped and the permanent current switch 13 is cooled by a cooling mechanism, namely, the refrigerator 12 and the cooling stage 11 or a refrigerant which is not depicted. Thereby, the superconducting wire which makes the permanent current switch 13 transits into the superconducting state with its resistance value of substantially zero and the permanent current switch 13 is placed in the closed (On) state. Subsequently, even while decreasing the current from the power supply 16 for exciting the superconducting coil, a current flowing through the superconducting coil 10 circulates via the permanent current switch 13 and, therefore, a value of current when the coil is excited can be maintained. After the current supplied from the power supply 16 for exciting the superconducting coil has becomes zero, the permanent current state is maintained in which a current continues to flow in a closed circuit formed by the superconducting coil and the permanent current switch 13, even though the power supply 16 for exciting the superconducting coil superconducting coil is decoupled from the circuit.

Figure 4:
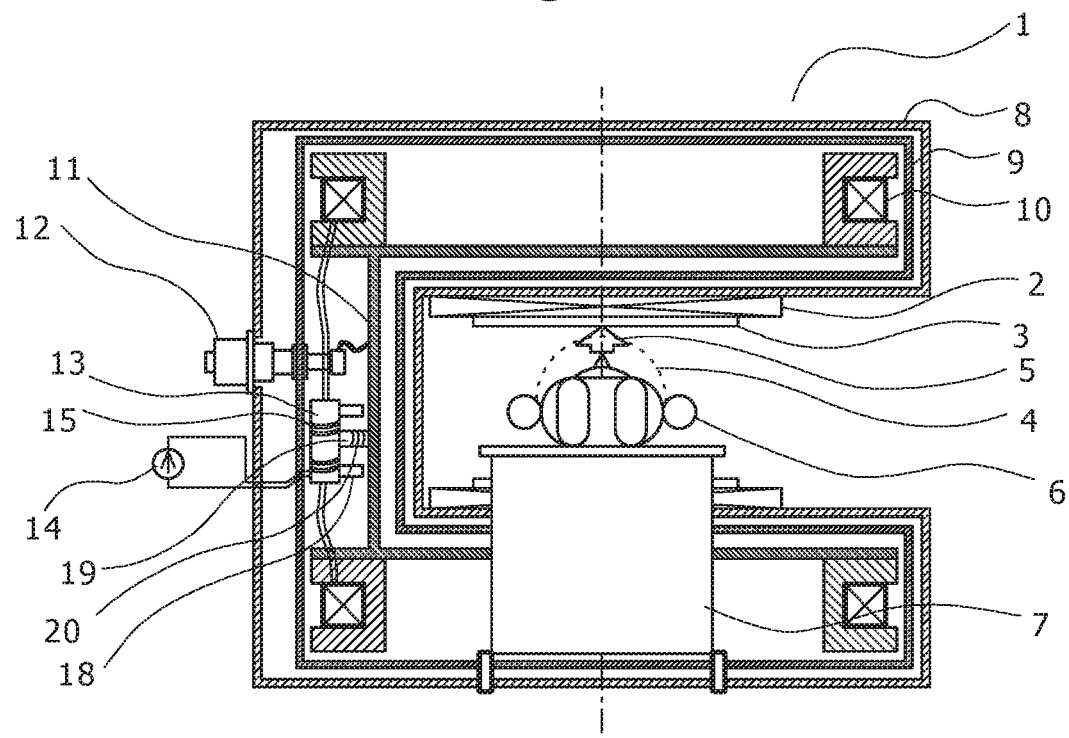
FIG. 4 is a cross-sectional diagram of an MRI apparatus, depicting another example of the first embodiment.

FIG. 4 depicts across-sectional diagram of another configuration of MRI apparatus 1 which is called an open type. In this MRI configuration, the superconducting magnet device 100 is comprised of a pair of upper and lower magnetic poles having a substantially disc shape. Each magnetic pole is comprised of a vacuum case 8 and a radiation shield, each of which has a substantially disc shape concentric with the magnetic pole 9, and a superconducting coil 10 having a substantially annular shape. The upper and lower magnetic poles generate a static magnetic field in a vertical direction 5 in an image capturing space 3 existing therebetween. Each superconducting coil 10 in upper and lower locations is cooled by the refrigerator 12 and the cooling stage 11 or a refrigerant which is not depicted in the same way as for the MRI apparatus 1 of the horizontal magnetic field type depicted in FIG. 2. In the open type MRI apparatus 1, a gradient coil 2 and a high frequency irradiation coil 3 are placed on a side facing the image capturing space of the upper and lower magnetic poles, these coils having a disc shape substantially concentric with the superconducting coil. Although a subject 6 is carried with a movable bed 7 into the image capturing space 3 between the upper and lower magnetic poles, this MRI apparatus has a feature in which it does not give an oppressive feeling to a subject because of a closed space, since the image capturing space is open on sides, except for a support pillar connecting the upper and lower magnetic poles.

Figure 1B:
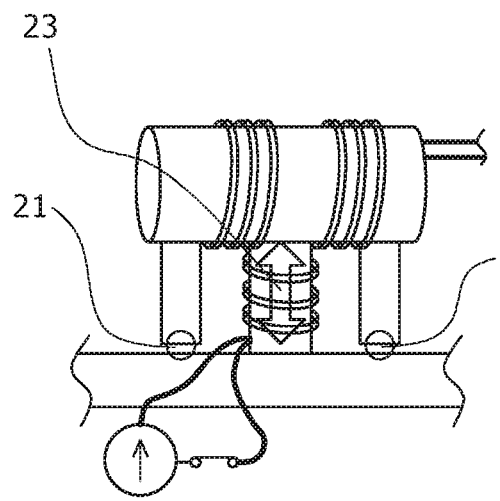
Figure 1C:
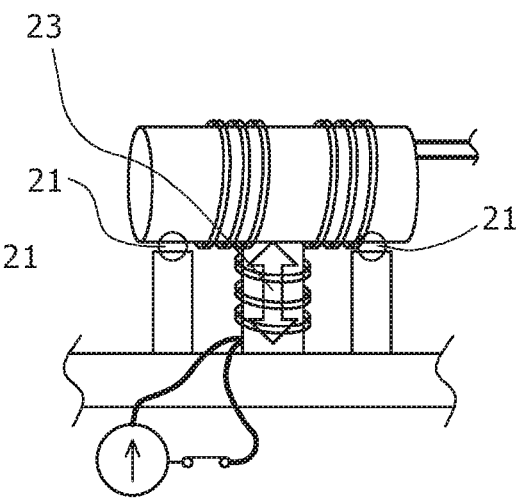

FIGS. 1A to 1C are diagrams depicting a schematic structure and operating states of the permanent current switch 13 with the electric heater 15 and the cooling stage 11 in the MRI apparatus 1 which is depicted in FIGS. 2 and 3, as a first embodiment of the present invention. In the present embodiment, the permanent current switch 13 is the one in which a superconducting wire, which is not depicted, is wound on a reel having a substantially cylindrical form in a winding form in which no magnetic field is generated, which is generally called noninductive winding. Both ends 17 of the superconducting wire which makes the permanent current switch 13 are connected to the superconducting coil 10, as in an electrical circuit configuration depicted in FIG. 3.

An electric heater 15 is laid on the surface of the permanent current switch 13. The electric heater 15 generates heat by being supplied with electric power from the heater power supply 14 for the permanent current switch, located outside of the magnet device, thereby increasing the temperature of the superconducting wire to turn it into the normal conducting state. The permanent current switch 13 has heat transfer paths which are formed between the permanent current switch and the cooling stage 11 connected to the refrigerator 12 with heat transfer members 18 for cooling (first columnar members). As depicted in FIG. 1A, the permanent current switch is cooled to transit into the superconducting state through the heat transfer members 18 for cooling, when the heater power supply 14 for the permanent current switch is Off, that is, the permanent current switch 13 is closed (On). At this time, the heat transfer paths are formed through contacts 21 between the heat transfer members 18 for cooling and the cooling stage 11 and a heat flow arises from the permanent current switch 13 as indicated by an arrow 22.

The permanent current switch 13 is also supported with respect to the cooling stage 11 by a thermal switch 19 (support member) which is made principally of a material having a large thermal shrinkage coefficient. As the material of the thermal switch 19, a material whose thermal shrinkage coefficient is large, such as, e.g., a PTFE (polytetrafluoroethylene) material is used. A heater 20 for heating the thermal switch is laid on the thermal switch 19 and this heater is comprised in a same electrical circuit including the electric heater 15 for the permanent current switch 13 and the heater power supply 14 for the permanent current switch.

A power supply for the heater for heating the thermal switch may be separate from or the same as the heater power supply 14 for the permanent current switch. By making a circuit configuration in which a current is supplied from a single power supply to both the electric heater 15 and the heater 20 for heating the thermal switch, it is possible to easily realize on/off control of the permanent current switch 13, which will be described later, and control to increase or suppress the thermal conductivity of the heat transfer paths including the heat transfer members 18 for cooling in configuration and it is possible to simplify the circuit configuration without increasing the amount of heat incursion from outside.

The thermal switch 19 is a member which positions the permanent current switch 13 with its one end being fixed to the permanent current switch 13. In the present embodiment, the other end of the thermal switch 19 is fixed to the cooling stage 11. The heat transfer members 18 for cooling are columnar members which are placed between the permanent current switch 13 and the cooling stage 11 and their one ends are fixed to either the permanent current switch 13 or the cooling stage 11. Although the heat transfer members 18 for cooling are drawn as columnar members in FIG. 1A, they may have any shape not limited to a columnar shape, providing they can form a heat transfer path by contacting the both members, i.e., the permanent current switch 13 and the cooling stage 11.

When the permanent current switch 13 is closed (On), as in FIG. 1A, electric power is not supplied from the heater power supply 14 for the permanent current switch and both the electric heater 15 and the heater 20 for heating the thermal switch (second electric heater) do not generate heat. Consequently, there occurs thermal shrinkage 23 of the thermal switch 19 cooled by the cooling stage 11 with secure contacts 21 between the heat transfer members 18 for cooling and cooling stage 11.

When the permanent current switch 13 is opened (Off), as in FIG. 1B, electric power is supplied from the heater power supply 14 for the permanent current switch and the electric heater 15 and the heater 20 for heating the thermal switch generate heat. Consequently, the temperature of the permanent current switch 13 and the thermal switch 19 increases and the thermal switch 19 expands thermally, as indicated by an arrow 23.

On the other hand, gaps 21 are made between the heat transfer members 18 for cooling and the cooling stage 11, in other words, the ends of the heat transfer members 18 for cooling, not fixed to another member, become disengaged, which interrupts the heat flow from the permanent current switch 13 to the cooling stage via the heat transfer members 18 for cooling. Therefore, because of the loss of the paths (heat transfer paths) for cooling the permanent current switch 13, the temperature increase is accelerated. As depicted in FIG. 1C, when the permanent current switch 13 is opened (Off), there may be gaps between the heat transfer members 18 for cooling situated, secured to the cooling stage 11 and the permanent current switch 13.

It is preferable that the thermal shrinkage characteristic, i.e., the thermal expansion coefficient of the thermal switch 19 is higher than that of the heat transfer members 18 for cooling. By making the thermal switch 19 of a material that is more shrinkable than the material of the heat transfer members 18 for cooling, a pressure to press the heat transfer members 18 for cooling against the cooling stage 11 arises when the temperature of the thermal switch 19 has become equal to that of the cooling stage 11 after the stop of heat generation by the heater 20 for heating the thermal switch. The presence of this pressure makes it possible to decrease the thermal resistance of the heat transfer paths which are formed by the cooling stage 11, permanent current switch 13, and heat transfer members 18 for cooling. From a perspective of increasing this pressure, it is preferable that, particularly in the axis of a direction from the permanent current switch 13 to the cooling stage 11, the linear expansion coefficient of the member supporting the permanent current switch 13, described as the thermal switch 19, is higher than the linear expansion coefficient of the first columnar members, described as the heat transfer members 18 for cooling, in the same axis direction.

As for the heights of the thermal switch 19 and the heat transfer members 18 for cooling, that is, their lengths along the axis of the direction from the permanent current switch 13 to the cooling stage 11, it is expedient that the height (length) of the transfer members 18 for cooling is equal to or slightly shorter than the height (length) of the thermal switch 19 under an environment where the superconducting magnet device of the present embodiment is used. If the lengths of both are equal, no gaps are formed between the heat transfer members 18 for cooling and the cooling stage 11, even when the thermal switch 19 has expanded at a maximum, and the thermal conductivity of the heat transfer paths formed by the heat transfer members 18 for cooling and the cooling stage 11 is adjusted according to the intensity of pressure exerted on the contact surfaces between the respective members changing depending on the degree of expansion of the thermal switch 19. In a case where a sufficiently high strength of the thermal switch 19 cannot be achieved, such a structure is adopted that the heat transfer members 18 for cooling are also used as a support structure and the structure around the permanent current switch 13 can be strengthened.

On the other hand, if the length of the heat transfer members 18 for cooling is made shorter than the length of the thermal switch 19, gaps are formed between the heat transfer members 18 for cooling and the cooling stage 11 and the heat transfer paths formed by them are physically cut off, when the thermal switch 19 has expanded at a maximum and. By adopting such a structure, it would become possible to physically cut off and establish the heat transfer paths and the permanent current switch 13 can be turned on/off at high speed.

As noted above, in the superconducting magnet device 100 of the present embodiment, in synchronization with timing to make the permanent current switch 13 transit to normal condition by heat generation by the electric heater 15, passing a current to the heater 20 for heating the thermal switch takes place. Heat thus generated expands the thermal switch 19, which decreases the speed of heat transfer between the permanent current switch 13 and the cooling stage 11 via the heat transfer members 18 for cooling. This results in decreasing heat that runs away to the cooling stage 11 assuming a proportion of the amount of heat that is given by the electric heater 15 to the permanent current switch 13.

It is thus possible to make the permanent current switch 13 transit to normal condition at high speed.

Besides, in synchronization with timing to stop the electric heater 15 and make the permanent current switch 13 transit to the superconducting state, passing a current to the heater 20 for heating the thermal switch takes place is stopped. Then, the thermal switch 19 shrinks, affected by cooling from the cooling stage 11. This shrinkage increases the speed of heat transfer between the permanent current switch 13 and the cooling stage 11 via the heat transfer members 18 for cooling. This results in increasing the efficiency of moving the amount of heat from the permanent current switch 13 to the cooling stage 11. It is thus possible to make the permanent current switch 13 transit to the superconducting state at high speed.

Figure 5:
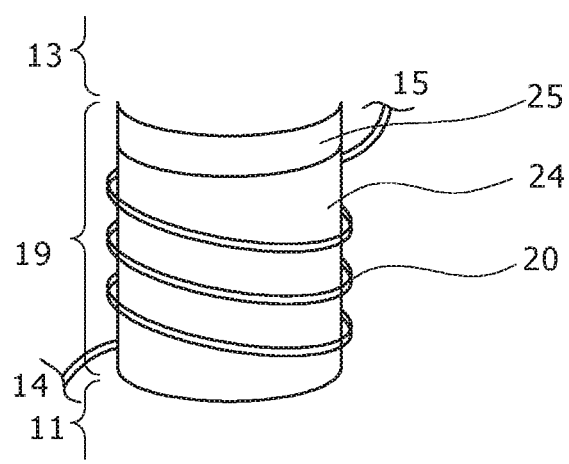
FIG. 5 is a fragmentary view depicting the structure of a thermal switch which is a component part of the permanent current switch which is a component of the first embodiment.

FIG. 5 depicts an enlarged view of the thermal switch portion in the first embodiment. The thermal switch 19 is a member that connects the cooling stage 11 and the permanent current switch 13 and is comprised of a thermally shrinking and expanding member 24 adjoining the cooling stage 11 and an adiabatic member 25 (plate-like member) adjoining the permanent current switch 13, both members combined in a layered manner. A material (e.g., PTFE) whose thermal shrinkage coefficient is large is used for the thermally shrinking and expanding member 24 and, for example, a glass fiber reinforced resin or the like is used for the adiabatic member 25. The heater 20 for heating the thermal switch is laid in contact with the thermally shrinking and expanding member 24 and changes the temperature of the thermally shrinking and expanding member 24. The adiabatic member 25 impedes the heat flow from the permanent current switch 13 to the cooling stage 11 and prevents the permanent current switch 13 from being cooled via the thermal switch 19 when the electric heater 15 is electrified and generates heat. Because the thermally shrinking and expanding member 24 is directly fixed to the cooling stage 11, heat is rapidly absorbed from the thermally shrinking and expanding member 24 to the cooling stage 11 upon the stop of passing a current to the heater 20 for heating the thermal switch and the thermally shrinking and expanding member 24 shrinks, as its temperature falls.

The adiabatic member 25 may be placed adjoining the cooling stage 11. It is preferable that adiabatic member 25 and the thermally shrinking and expanding member 24 have a nearly equivalent coefficient of thermal expansion in a direction of the contact surface therebetween. This is because the nearly equivalent characteristic of thermal expansion they have makes it possible to maintain the strength of bonding between the two members and produces an effect of preventing peel-off.

In the foregoing example, an example is described in which both the thermal switch 19 and the heat transfer members 18 for cooling are placed between the permanent current switch 13 and the cooling stage 11. But, the other end of the thermal switch 19 may be fixed to, for example, a member that is different from the cooling stage 11. In this case, if the moving direction of expansion and shrinkage of the thermal switch 19 is substantially the same as the axial direction from the permanent current switch 13 to the cooling stage 11, it is possible to realize both movements of shortening and elongating the distance between the permanent current switch 13 and the cooling stage 11.

Therefore, in the example of FIGS. 1A to 1C, the thermal switch 19 with its one end fixed to the permanent current switch 13 may extend upward in a vertical direction and its other end may be fixed to a member that is different from the cooling stage 11. If the temperature of the member to which the other end is fixed is higher than that of the cooling stage 11, it is expedient to place the adiabatic member 25 also in the other end side. Placement under an evaporated refrigerant environment is expedient to cool the thermally shrinking and expanding member 24.

FIGS. 6A to 6E depict an example of a structure making a contact or a gap between one of the heat transfer members 18 for cooling and the cooling stage 11 in the first embodiment. When the permanent current switch is closed (On), heat transfer via the contacts between the heat transfer members 18 for cooling and the cooling stage 11 occurs. Thermal resistance involved in contact heat transfer is generally larger in comparison with heat conduction in solids; therefore, it is needed to decrease this.

FIG. 6A is an example in which the area of the contact portion is reduced. This embodiment is a suitable shape for a case where a sufficient contact surface pressure cannot be expected to be provided by the amount of displacement due to thermal shrinkage of the thermal switch 19. FIG. 6B is an example in which a flexible member 26 with good thermal conductivity is used for the contact surface to improve contact heat transfer.

When contact surface pressure arises between the heat transfer members 18 for cooling and the cooling stage 11 because of thermal shrinkage of the thermal switch 19, the flexible member 26 deforms, which can reduce contact thermal resistance attributed to a gap in the contact surface. As the material of the flexible member, suitable is metal that is flexible and has good thermal conductivity even at an extremely low temperature, such as indium.

FIG. 6C depicts a structure in which a heat transfer member 18 for cooling with a tapered head is inserted into a hole formed in the cooling stage 11. This embodiment is a suitable manner for a case where a large amount of thermal shrinkage is obtained by the thermal switch 19. Because the contact surface is tapered, the contact surface pressure gradually increases, as the thermal switch 19 shrinks thermally. This provides secure contacts between the heat transfer members 18 for cooling and the cooling stage 11.

FIG. 6D or 6E depicts an embodiment in which either of the contact surfaces of a heat transfer member 18 for cooling and of the cooling stage 11 is formed into a thin plate portion which deforms like a spring. In FIG. 6D, a heat transfer member 18 for cooling has a contact portion formed into a spring shape 27; In FIG. 6E the cooling stage 11 has a contact portion formed into a spring shape 27. Displacement along with shrinkage of the thermal switch 19 deforms the spring shape portion and thus increases the contact area and, at the same time, the contact surface pressure can be maintained by repulsion force of the spring.

Although the shapes depicted in FIGS. 6A to 6E are described as those for increasing contact heat transfer between the heat transfer members 18 for cooling and the cooling stage 11, these shapes can similarly be applied also for a case where contacts and gaps are provided between the permanent current switch 13 and the heat transfer members 18 for cooling.

While, in the foregoing example, the superconducting magnet device 100 in which the cooling stage 11 forms apart of the heat transfer paths is described, a liquid or solid refrigerant may be used instead of the cooling stage 11. In this case, the heat transfer members 18 for cooling is fixed to the permanent current switch 13 or fixed to the bottom of a refrigerant reservoir for storing the refrigerant. Therefore, in this case, the refrigerant reservoir serves as the first cooling member instead of the cooling stage 11. It is not needed to fill the refrigerant reservoir with the refrigerant fully. For example, if the refrigerant is stored to an extent so that it does not contact the permanent current switch 13, the thermal conductivity of the heat transfer paths is adjusted by the thermal switch 19, as described previously, and on/off control of the permanent current switch 13 can be performed rapidly. Because it is not needed to fill the refrigerant reservoir with the refrigerant, an effect of saving the amount of use of the refrigerant is provided.

As described hereinbefore, the superconducting magnet device 100 of the present embodiment includes, in its configuration, the superconducting coil 10, the permanent current switch 13 which forms a closed circuit along with the superconducting coil 10, the electric heater 15 (first electric heater) laid on the permanent current switch 13, the thermal switch 19 (support member) which is fixed to the permanent current switch 13 and supports the permanent current switch, the heater 20 for heating the thermal switch (second electric heater) laid on the thermal switch 19, the cooling stage 11 (first cooling member) which is cooled by a refrigerant or refrigerator, the heat transfer members 18 for cooling (first columnar members) placed between the permanent current switch 13 and the cooling stage 11 and fixed to either the permanent current switch 13 or the cooling stage 11. The device is designed so that the thermal expansion coefficient of the thermal switch 19 will be higher than the thermal expansion coefficient of the heat transfer members 18 for cooling.

According to this superconducting magnet device 100, when the permanent electric current switch 13 is switched to the open state, the electric heater 15 laid on the permanent current switch 13 is electrified and generates heat. In synchronization with this, the heater 20 for heating the thermal switch laid on the thermal switch 19 is electrified and generates heat. This heat generation increases the temperature of the thermal switch 19 and the thermal switch 19 expands, which cuts off the heat transfer paths which are formed by the permanent current switch 13, cooling stage 11, and heat transfer members 18 for cooling or decreases the thermal conductivity of the heat transfer paths. Thus, a condition is created in which heat is efficiently given to the permanent current switch 13 from the electric heater 15 and, therefore, the permanent current switch 13 transits to normal conduction rapidly.

When the permanent electric current switch 13 is switched to the closed state, passing a current to the electric heater 15 laid on the permanent current switch 13 is stopped and heat generation is also stopped. In synchronization with this, the heater 20 for heating the thermal switch laid on the thermal switch 19 is also stopped. Then, the thermal switch 19 that has expanded with its temperature increased shrinks with its temperature decreasing, as heat is drawn by cooling stage 11. Thereby, the heat transfer paths which are formed by the permanent current switch 13, cooling stage 11, and heat transfer members 18 for cooling are established or the thermal conductivity of the heat transfer paths increases. Heat can be moved efficiently from the permanent current switch 13 toward the cooling stage 11 and the permanent current switch 13 can be made to change to have a temperature below the transition temperature rapidly.

Put plainly, the superconducting magnet device 100 of the present embodiment enables switching the permanent current switch 13 on/off rapidly. Because a mechanism for establishing and cutting off the heat transfer paths or adjusting the thermal conductivity of these paths is configured only inside the vacuum case or the radiation shield, it is possible to provide the superconducting magnet device 100 that is stable with less heat entry paths and without a driving mechanism or the like connected to an external unit. Because of less heat incursion, it is enabled to save, inter alia, electric power consumed by the refrigerator 12.

Besides, the superconducting magnet device 100 described in the present embodiment is especially useful for a case in which a so-called high temperature superconducting wire whose transition temperature is 25 K or higher is used. It is required to cool a wire made of a high temperature superconducting material (high temperature superconducting wire), giving a margin for the temperature of transition to normal conduction, in order to stably keep the wire superconducting. Likewise for the permanent current switch, it is required to cool it sufficiently in the superconducting state (closed). On the other hand, to make transition to the normal conducting state (open), the wire is heated by the electric heater, as done for the niobium titanium wire. To heat a high temperature superconducting wire, the heater output has to be increased, because temperature difference to rise up to the temperature of transition to normal conduction is larger and specific heat is larger, as compared with the niobium titanium wire. However, according to the structure described in the present embodiment, it is possible to enhance the cooling performance by increasing the thermal conductivity of the heat transfer paths for a period when the superconducting state should be maintained and to increase the heating efficiency by decreasing the thermal conductivity of the heat transfer paths or cutting off the heat transfer paths for a period when transition to normal conduction should be made.

The MRI apparatus 1 utilizing the superconducting magnet device 100 described in the present embodiment enables it to obtain good image quality, because passing of a stable permanent current can be realized.

Second Embodiment

Figure 7A:
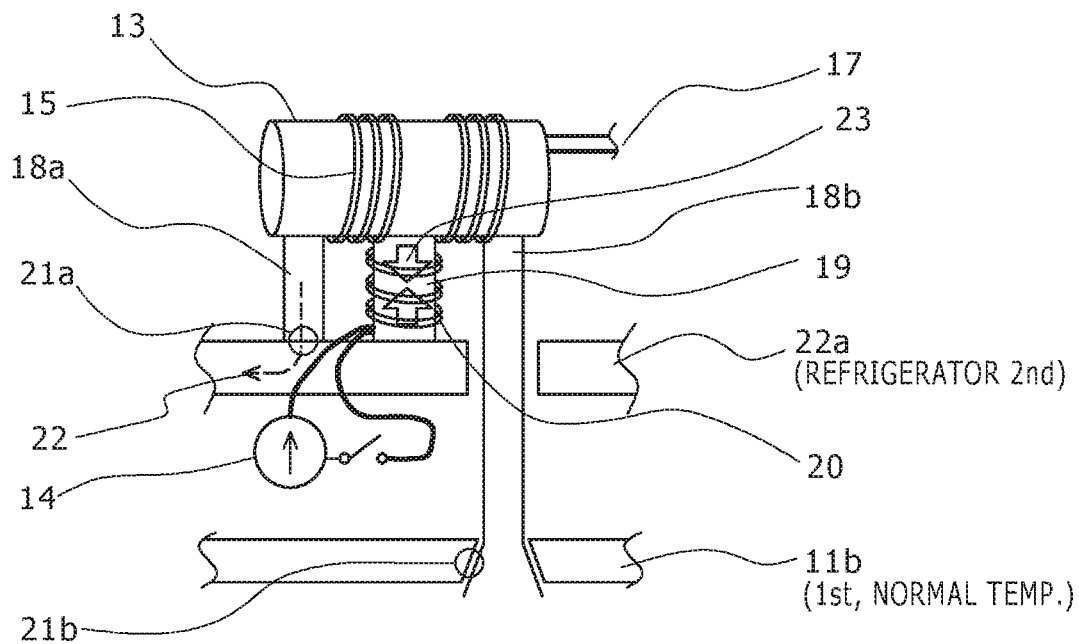
FIGS. 7A and 7B are schematic perspective views depicting the structure and operation of a permanent current switch part which is a component of a superconducting magnet device of a second embodiment.
Figure 7B:
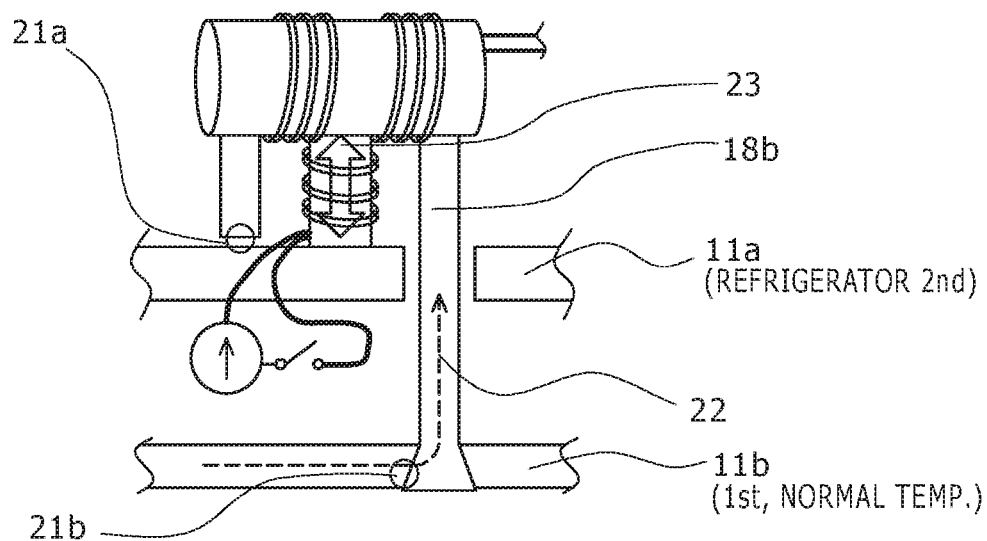

Configuration and operation of a permanent current switch part in a superconducting magnet device of a second embodiment of the present invention or an MRI apparatus using that magnet device are depicted in FIGS. 7A and 7B.

Configuration including the permanent current switch 13, the heater power supply 14 for the permanent current switch, the electric heater 15, the thermal switch 19, and the heater 20 for heating the thermal switch is the same as for the first embodiment. When the permanent current switch 13 is closed (On), the permanent current switch 13 in the present embodiment is cooled via a heat transfer member 18a for cooling from a cooling stage 11a, as depicted in FIG. 7A. When the permanent current switch is opened (Off), its temperature increase can be accelerated by heat that flows in via a heat transfer member 18b for heating (second columnar member) from a heating stage 11b, as depicted in FIG. 7B.

Assuming that a two-stage refrigerator is used as means for cooling the superconducting magnet device, the cooling stage 11a is connected to a low temperature end (second stage) of the refrigerator. If a liquid refrigerant is used, the cooling stage 11a is cooled by the liquid refrigerant. On the other hand, the heating stage 11b is connected to a high temperature end (first stage) of the two-stage refrigerator, if used, or a member whose temperature is higher than a transition temperature at which the permanent current switch transits to normal conduction, such as the radiation shield or vacuum case.

More specifically, when the permanent current switch in FIG. 7A is closed (On), the heat transfer member 18a for cooling comes in contact 21a with the cooling stage 11a due to thermal shrinkage of the thermal switch 19 and a gap 21b is made between the heat transfer member 18b for heating and the heating stage 11b. On the other hand, when the permanent current switch in FIG. 7B is opened (Off), the heat transfer member 18b for heating comes in contact 21b with the heating stage 11b due to thermal expansion of the thermal switch 19 ad a gap is made between the heat transfer member 18a for cooling and the cooling stage 11a.

The heat transfer member 18b for heating is a member, one end of which is fixed to the permanent current switch 13 and the other end of which has a shape like a bolt head which is installed through a hole formed in the heating stage 11b, as depicted in FIGS. 7A and 7B. Because the hole formed in the heating stage 11b is smaller than the bolt head shaped portion, this portion is fit in the heating stage 11b when the thermal switch 19 shrinks and behaves such that the bottom face of this bolt head shaped portion is pushed against the heating stage 11b. The term "bolt head-like portion" mentioned here is the one that is used to explain FIGS. 7A and 7B simply. This means that the other end should preferably have an enlarged portion.

The joint portion between the other end of the heat transfer member 18b for heating and the heating stage 11b has a tapered shape, as depicted in FIGS. 7A and 7B, which enlarges the contact area and can give some margin to the accuracy of installing the other end of the heat transfer member 18b for heating through the hole of the heating stage 11b.

According to the present embodiment, it would become possible to open and close the permanent current switch 13 using smaller electric heater capacity and heater power supply and it is possible to reduce refrigerant consumption and electric power consumed by the refrigerator 12 in the superconducting magnet device 100.

Third Embodiment

Figure 8:
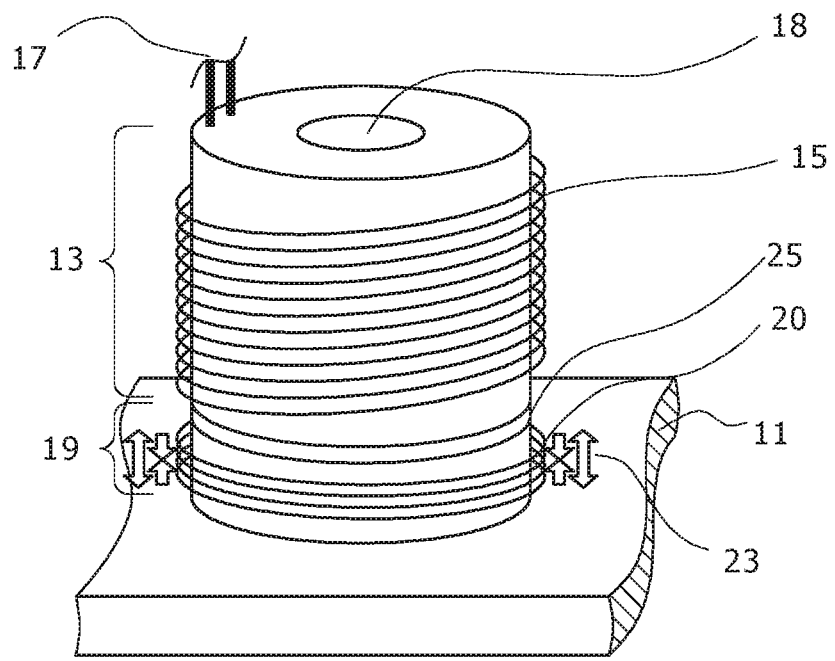
FIG. 8 is a schematic perspective view depicting the structure of a permanent current switch part of a superconducting magnet device of a third embodiment.
Figure 9:
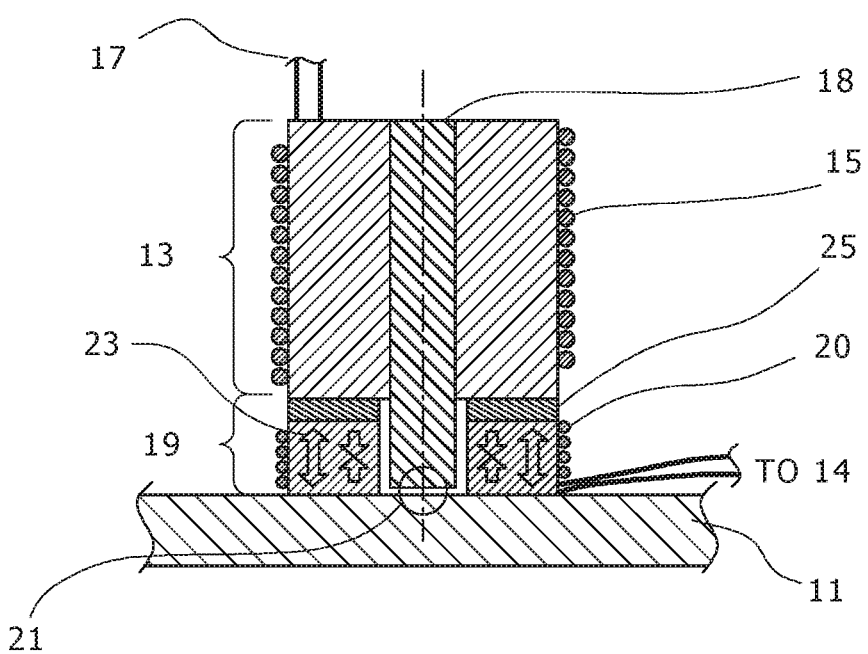
FIG. 9 is a cross-sectional view depicting the structure and operation of the permanent current switch part of the superconducting magnet device of the third embodiment.

A partial perspective view and a partial cross-sectional view concerning a permanent current switch 13 that is applied to a superconducting magnet device 100 of a third embodiment of the present invention or an MRI apparatus using that magnet device are depicted in FIG. 8 and FIG. 9, respectively.

In the present embodiment, a permanent current switch 13 and a thermal switch 19 are substantially cylinders which are substantially concentric. The permanent current switch 13 is stacked on the top of the thermal switch 19. A heat transfer member 18 for cooling is a cylindrical member with its central axis being substantially the same as for the above cylinders and contacting the inner cylinder surface of the above cylinders or a columnar member which is placed in the bore of the above cylinders. Assuming that the permanent current switch 13 and the thermal switch 19 have a substantially equal outside diameter, a structure in which the permanent current switch 13 is stacked on the thermal switch 19 can be considered as one member. The heat transfer member 18 for cooling may be a solid member which is internally dense.

"Substantially concentric" mentioned here means a placement relation in which the cylinders can be regarded as concentric in practical design, not limited to that the cylinders are exactly concentric. "Cylinders" mentioned here are not limited to an exactly cylindrical form and may be, e.g., rectangular cylinders. The above cylinders 19 may be the one in which a plurality of columnar members are arranged circularly.

The permanent current switch 13 is supported on the top of the thermal switch 19 on the cooling stage 11. When the permanent current switch 13 is closed (On), the heat transfer member 18 for cooling comes in contact with the cooling stage due to thermal shrinkage of thermal switch 19. When the permanent current switch 13 is opened (Off), a gap is made between the heat transfer member 18 for cooling and the cooling stage 11 due to thermal expansion of the thermal switch 19. This principle is the same as for the first embodiment. Without forming a gap 21, another configuration may be made so that the contact surface cooling stage pressure between the heat transfer member 18 for cooling and the 11 will be kept high when the permanent current switch 13 is closed and kept low when the permanent current switch 13 is opened.

In the present embodiment, it is preferable that the length of the heat transfer member 18 for cooling in a height direction is slightly shorter than the height of the stacked structure comprised of the permanent current switch 18, when it expanded at a maximum, and the thermal switch 19, as depicted in FIG. 9. It is expedient that the heat transfer member 18 for cooling is placed so that its side surface at least in its end portion is fixed to the inner cylinder surface of the permanent current switch 13 for end face alignment on the side opposite to the cooling stage 11. By this placement, a gap 21 is formed when the thermal switch 19 has been expanded at a maximum; that is, the heat transfer path between the permanent current switch 13 and the cooling stage 11 can be cut off.

By the configuration as described above, the structure supporting the permanent current switch 13 can be simplified and the switch can be solidly supported against machinery vibration or the like.

Fourth Embodiment

Figure 10:
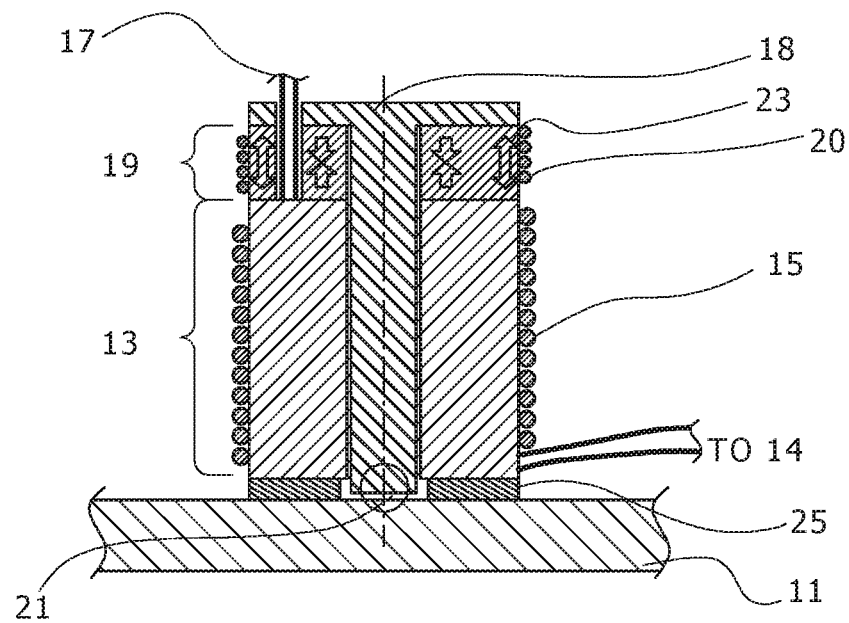
FIG. 10 is a cross-sectional view depicting the structure and operation of a permanent current switch part of a superconducting magnet device of a fourth embodiment.

A partial cross-sectional view of a fourth embodiment of the present invention is depicted in FIG. 10.

In the present embodiment, a permanent current switch 13 is of a cylindrical form with the same central axis as for a thermal switch 19, as is the case for the third embodiment, and these switches are interconnected. Assuming that the cooling stage 11 is the bottom, an adiabatic member 25 is placed on the cooling stage 11, the permanent current switch 13 is placed on the top of the adiabatic member, and the thermal switch 19 is further stacked on the top of the permanent current switch.

The heat transfer member 18 for cooling is T-shaped in cross section and has a structure in which its vertical portion of T is inserted so as to come in contact with the inner cylinder surface of a cylindrical member formed by the permanent current switch 13 and the thermal switch 19 and its horizontal portion of T extends over the top end portion of the thermal switch 19. It is expedient to design the size of the heat transfer member 18 for cooling, taking account of the size of the thermal switch, when it expands at maximum, so that a gap 21 is formed between the end of the vertical portion of T proximate to the cooling stage 11 and the cooling stage 11.

In the present embodiment that adopts the configuration as described above, the position of the permanent current switch 13 does not move, as the thermal switch 19 shrinks and expands thermally. Thus, deformational stress is not generated in the superconducting wire which makes the permanent current switch 13 and a more stable current passing operation can be expected in the superconducting state when the permanent current switch is closed (On).

Fifth Embodiment

Figure 11:
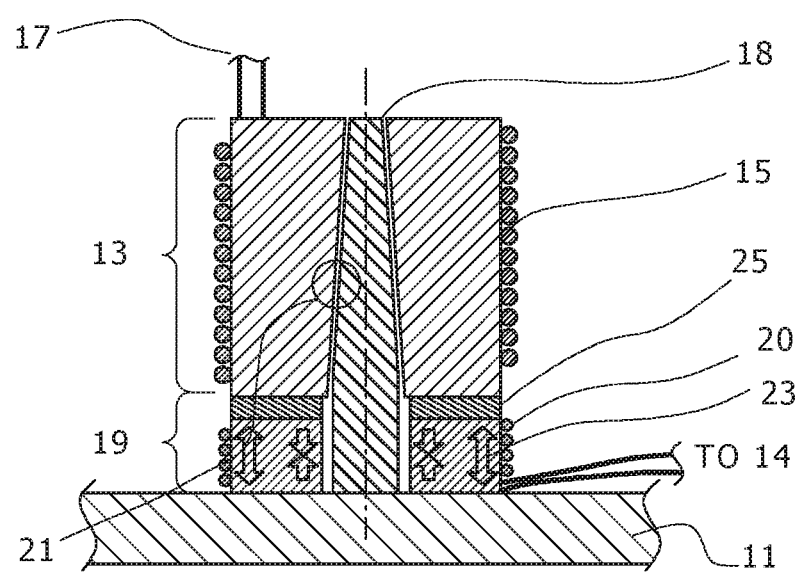
FIG. 11 is a cross-sectional view depicting the structure and operation of a permanent current switch part of a superconducting magnet device of a fifth embodiment.

A partial cross-sectional view of a fifth embodiment of the present invention is depicted in FIG. 11.

In the present embodiment, a permanent current switch 13 is of a cylindrical form with the same central axis as for a thermal switch 19, as is the case for the third embodiment, and these switches are connected with the intermediate positioning of an adiabatic member 25. The permanent current switch 13 is supported on the top of the thermal switch 19 on the cooling stage 11.

A heat transfer member 18 for cooling is of a substantially cylindrical form with the same axis as for the permanent current switch 13 and the thermal switch 19, as is the case for the third embodiment, and it is placed on the side of the central axis. However, the heat transfer member 18 for cooling is fixed to the cooling stage 11 and a contact or gap 21 is made between the heat transfer member for cooling and the permanent current switch due to thermal shrinkage or expansion of the thermal switch 19.

More specifically, as depicted in FIG. 11, in the present embodiment, the heat transfer member 18 for cooling has a conical or truncated conical shape with its diameter tapering toward the end face opposite to the contact surface with the cooling stage. Thus, its cross section is of a tapered shape as depicted in FIG. 11. On the other hand, the inner cylinder surface of the permanent current switch 13 has a reversely tapered shape mating with the tapered shape of the heat transfer member 18 for cooling. Thereby, the contact area between the heat transfer member 18 for cooling and the permanent current switch 13 can be widened when thermal switch 19 expands at a maximum. Thus, it is possible to more rapidly absorb heat from the permanent current switch 13 and decrease its temperature.

According to the present embodiment, the heat capacity when the permanent current switch is opened (Off) is reduced and the heat transfer member for cooling is always kept at low temperature by the cooling stage. Thus, it is possible to reduce electric heater capacity and open and close the permanent current switch at high speed.

Sixth Embodiment

Figure 12:
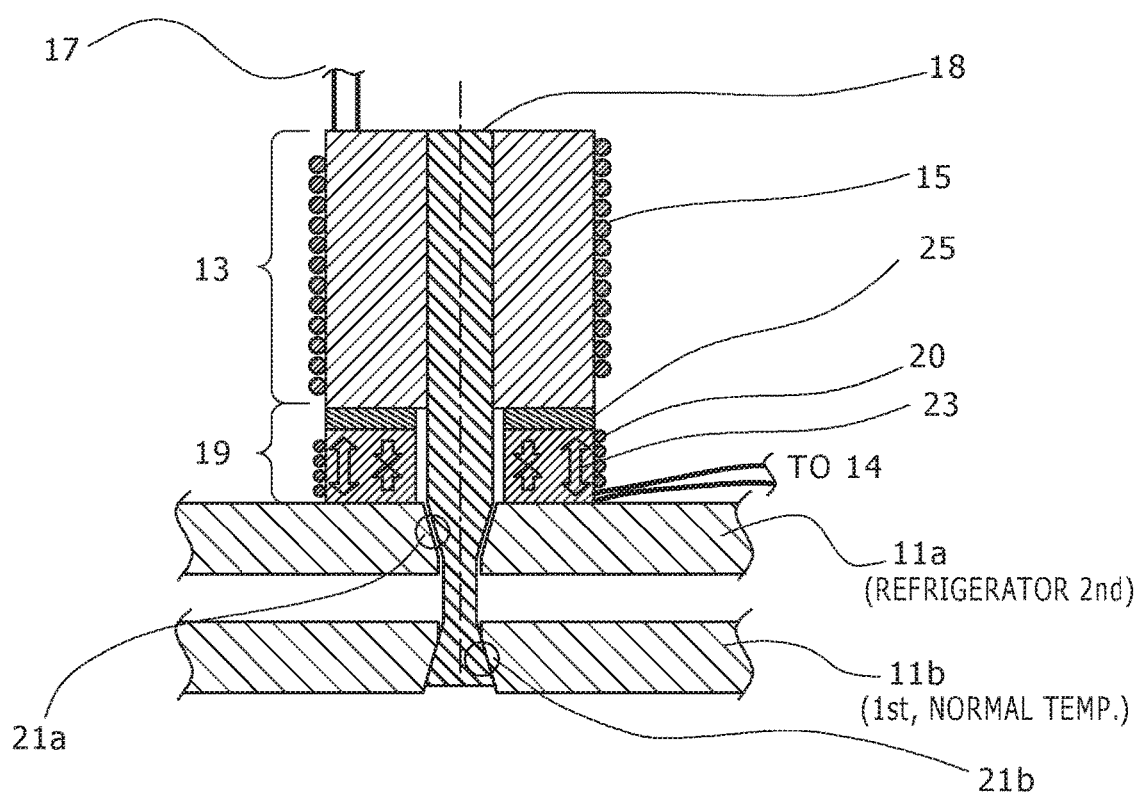
FIG. 12 is a cross-sectional view depicting the structure and operation of a permanent current switch part of a superconducting magnet device of a sixth embodiment.

A partial cross-sectional view of a sixth embodiment of the present invention is depicted in FIG. 12.

In the present embodiment, a permanent current switch 13 is of a cylindrical form with the same central axis as for a thermal switch 19, as is the case for the third embodiment, and these switches are interconnected with the intermediate positioning of an adiabatic member 25. The permanent current switch 13 is supported on the top of the thermal switch 19 on the cooling stage 11.

A heat transfer member 18 for cooling is of a substantially cylindrical form with the same axis as for the permanent current switch 13 and the thermal switch 19, as is the case for the third embodiment, and it is placed on the side of the central axis. Its side surface at least in its end portion is fixed to the permanent current switch 13.

In the present embodiment, when the permanent current switch 13 is closed (On), that is, the thermal switch 19 shrinks thermally, the heat transfer member 18 for cooling comes in contact 21*a* with the cooling stage 11*a* and a gap is made between it and the heating stage 11*b*. On the other hand, when the permanent current switch 13 is opened (Off), a gap 21*a* is made between the heat transfer member 18 for cooling and the cooling stage 11*a* and the heat transfer member 18 for cooling comes in contact with the heating stage 11*b*. Therefore, the heat transfer member 18 for cooling is a member which incorporates in part or similarly serves as the previously described heat transfer member 18*b* for heating and plays different roles depending on making contact with which of the cooling stage 11a and the heating stage 11b (second cooling member). The heating stage 11b may be, e.g., a member having normal temperature. By adopting the structure as described above, it would become possible to realize rapid on/off control of the permanent current switch 13, while decreasing the number of component parts.

The heat transfer member 18 for cooling in the present embodiment, for example, as depicted in FIG. 12, has a columnar or cylindrical form in a part which is placed contacting the inner cylinder surface of the permanent current switch 13 and the switch 19, a reversely tapered shape narrowing gently in a part passing through the cooling stage 11a, and a tapered shape thickening gently in a lower part passing through the heating stage 11b.

A hole is provided in the cooling stage 11a to allow the heat transfer member 18 for cooling to pass through and the inside wall of the hole has a shape allowing for a wide contact area, mating with the reversely tapered shape formed on the heat transfer member 18 for cooling, previously described. Likewise, a hole is also provided in the heating stage 11b to allow the heat transfer member 18 for cooling to pass through and the inside wall of the hole has a shape allowing for a wide contact area, mating with the tapered shape formed on the heat transfer member 18 for cooling previously described.

Accordingly, in the present embodiment, when the permanent current switch 19 is switched to the closed state, the contact area between the heat transfer member 18 for cooling and the cooling stage 11a can be widened and, therefore, the temperature of the permanent current switch 19 can be decreased rapidly. When the permanent current switch 19 is switched to the open state, the contact area between the heat transfer member 18 for cooling and the heating stage 11b can be widened and, therefore, the temperature of the permanent current switch 19 can be increased rapidly.

According to the present embodiment, the heat transfer member 18 for cooling can be used not only for cooling the permanent current switch 13 but also for heating it. Thus, it would become possible to reduce refrigerant consumption and electric power consumed by the refrigerator due to reduction in electric heater capacity and operation of rapidly opening and closing the permanent current switch 13 would become feasible. Also in the second through sixth embodiments, each of the structures depicted in FIGS. 6A to 6E enables reducing thermal resistance attributed to solid-to-solid contact between the heat transfer member 18 for cooling and the cooling and heating stages 11a, 11b or between the heat transfer member 18 for cooling and the permanent current switch 13.

Any of the embodiments described hereinbefore can be used in a way that one is combined with another freely. Application is not limited to magnetic resonance imaging apparatus and a wide range of application is possible including accelerators using superconductors and general equipment that applies superconductivity.

The superconducting magnet device 100 of any embodiment enables switching the permanent current switch 13 on/off rapidly. Because a mechanism for establishing and cutting off the heat transfer path(s) or adjusting the thermal conductivity of the path(s) is configured only inside the vacuum case or the radiation shield, it is possible to provide the superconducting magnet device 100 that is stable with less heat entry paths and without a driving mechanism or the like connected to an external unit. Because of less heat incursion, it is enabled to save, inter alia, electric power consumed by the refrigerator 12.

Besides, the superconducting magnet device 100 described in each of the embodiments is especially useful for a case in which a so-called high temperature superconducting wire whose transition temperature is 25 K or higher is used. According to the structure described herein, it is possible to enhance the cooling performance by increasing the thermal conductivity of the heat transfer path(s) for a period when the superconducting state should be maintained and to increase the heating efficiency by decreasing the thermal conductivity of the heat transfer path(s) or cutting off the heat transfer path(s) for a period when transition to normal conduction should be made. Thus, even if there is a difference between steady-state temperature in an operation environment of the superconducting magnet device 100 and the transition temperature of a superconducting wire, rapid excitation and demagnetization work can be realized and a contribution can be made to work efficiency improvement.

What is claimed is:

1. A superconducting magnet device comprising:
    a superconducting coil;
    a permanent current switch forming a closed circuit along with the superconducting coil;
    a first electric heater which is laid on the permanent current switch;
    a support member which is fixed to the permanent current switch;
    a second electric heater which is laid on the support member;
    a first cooling member which is cooled by a refrigerant or a refrigerator; and
    a first columnar member which is placed between the permanent current switch and the first cooling member and fixed to one of the permanent current switch and the first cooling member,
    wherein the support member has a coefficient of thermal expansion that is higher than the coefficient of thermal expansion of the first columnar member.

2. The superconducting magnet device according to claim 1,
    wherein the support member is fixed to the first cooling member, and
    the permanent current switch is supported via the support member on the first cooling member.

3. The superconducting magnet device according to claim 1,
    wherein the permanent current switch and the support member have a substantially cylindrical form, which is substantially concentric,
    the support member is fixed to the first cooling member, and
    the permanent current switch is fixed to the support member.

4. The superconducting magnet device according to claim 1,
    wherein pressure that is exerted on the contact surface between the first cooling member and the first columnar member, in a state in which the support member shrinks when the second electric heater is turned off, is higher than pressure that is exerted on the contact surface between the first cooling member and the first columnar member in a state in which the support member expands by heat generated by the second electric heater.

5. The superconducting magnet device according to claim 1, wherein the first columnar member is connected to the first cooling member and the permanent current switch in the state in which the support member shrinks when the second electric heater is turned off, and one end of the first columnar member is fixed to the first cooling member or the permanent current switch and the other end is disengaged in the state in which the support member expands by heat generated by the second electric heater.

6. The superconducting magnet device according to claim 1, wherein the transition temperature of a superconducting wire which makes the superconducting coil and the permanent current switch is 25 Kelvin degrees or higher.

7. A magnetic resonance imaging apparatus comprising:

a static magnetic field device including the superconducting magnet device according to claim 1;

a gradient coil which superposes a gradient magnetic field on a static magnetic field which is generated by the static magnetic field device; and a high frequency irradiation coil which applies high frequency pulses to a region in which the gradient magnetic field is superimposed.

* * * * *